(12) United States Patent
Brennan et al.

(10) Patent No.: US 7,118,925 B2
(45) Date of Patent: Oct. 10, 2006

(54) FABRICATION OF A FERROMAGNETIC INDUCTOR CORE AND CAPACITOR ELECTRODE IN A SINGLE PHOTO MASK STEP

(75) Inventors: Kenneth D. Brennan, Plano, TX (US); Satyavolu S. Papa Rao, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/008,900

(22) Filed: Dec. 10, 2004

(65) Prior Publication Data

US 2006/0128036 A1    Jun. 15, 2006

(51) Int. Cl.
*H01L 21/00* (2006.01)

(52) U.S. Cl. .................. 438/3; 438/618; 438/620; 438/622; 257/531; 257/E21.022; 257/E27.046

(58) Field of Classification Search .......... None
See application file for complete search history.

(56) References Cited

U.S. PATENT DOCUMENTS 5,793,272 A * 8/1998 Burghartz et al. .......... 336/200
6,037,649 A    3/2000 Liou
2004/0245636 A1 * 12/2004 Cooney et al. ............. 257/758

OTHER PUBLICATIONS

Kenneth D. Brennan, et al., "System for Integrating a Toroidal in a Semiconductor Device" U.S. Appl. No. 09/953,310, filed Sep. 10, 2001.
Kenneth D. Brennan, et al., "Method to Improve Inductance with a High-Permeability Slotted Plate Core in an Integrated Circuit" U.S. Appl. No. 10/906,046, filed Jul. 30, 2004.

* cited by examiner

*Primary Examiner*—Dung A. Le
(74) *Attorney, Agent, or Firm*—Rose Alyssa Keagy; W. James Brady; Frederick J. Telecky, Jr.

(57) ABSTRACT

A method of manufacturing an integrated circuit on a semiconductor wafer. The method comprising forming a bottom plate of a capacitor 50a and a bottom portion of an induction coil 50a, forming an etch stop layer 250', forming a ferromagnetic capacitor top plate 20a and a ferromagnetic core 20b, forming a top portion of the induction coil 50b plus vias 50c that couple the top portion of the induction coil 50b to the bottom portion of the induction coil 50c.

22 Claims, 16 Drawing Sheets

FABRICATION OF A FERROMAGNETIC INDUCTOR CORE AND CAPACITOR ELECTRODE IN A SINGLE PHOTO MASK STEP

BACKGROUND OF THE INVENTION

This invention is directed to integrated circuit capacitors, inductors and transformers, and a method of fabricating them.

DETAILED DESCRIPTION OF THE INVENTION

Figure 1:
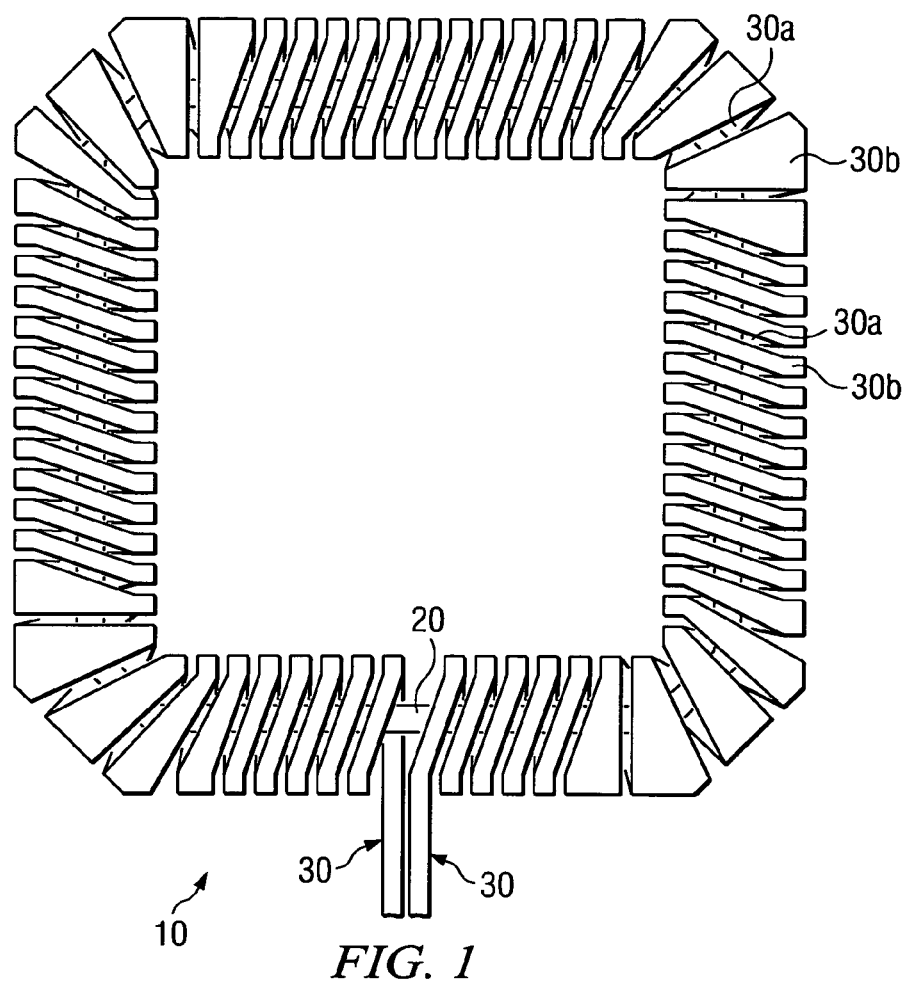
FIG. 1 is a top view of a toroidal inductor with a ferromagnetic core in accordance with the present invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a top view of a toroidal inductor 10 with a ferromagnetic core 20 in accordance with the present invention. The toroidal inductor 10 is a three dimensional inductor having an induction coil 30 that wraps around a ferromagnetic core 10 numerous times. Only the ferromagnetic core 20, the bottom portion of the induction coil 30*a* and top portion of the induction coil 30*b* can be seen from the top view shown in FIG. 1.

Figure 2:
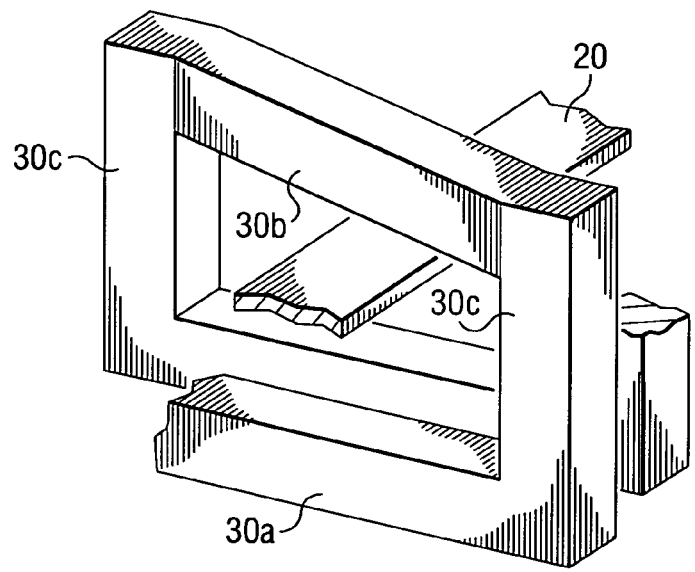
FIG. 2 is a three-dimensional view of a portion of the toroidal inductor of FIG. 1.

FIG. 2 is a three-dimensional view of a portion (as indicated in FIG. 1) of the toroidal inductor 10. This view illustrates the parallel bottom induction coils 30*a* and the diagonal top induction coils 30*b* of this example application. FIG. 2 also shows the vias 30*c* that physically and electrically connect the bottom induction coils 30*a* to the top induction coils 30, thereby creating the inductor coil helix around the inductor core 20.

Figure 3:
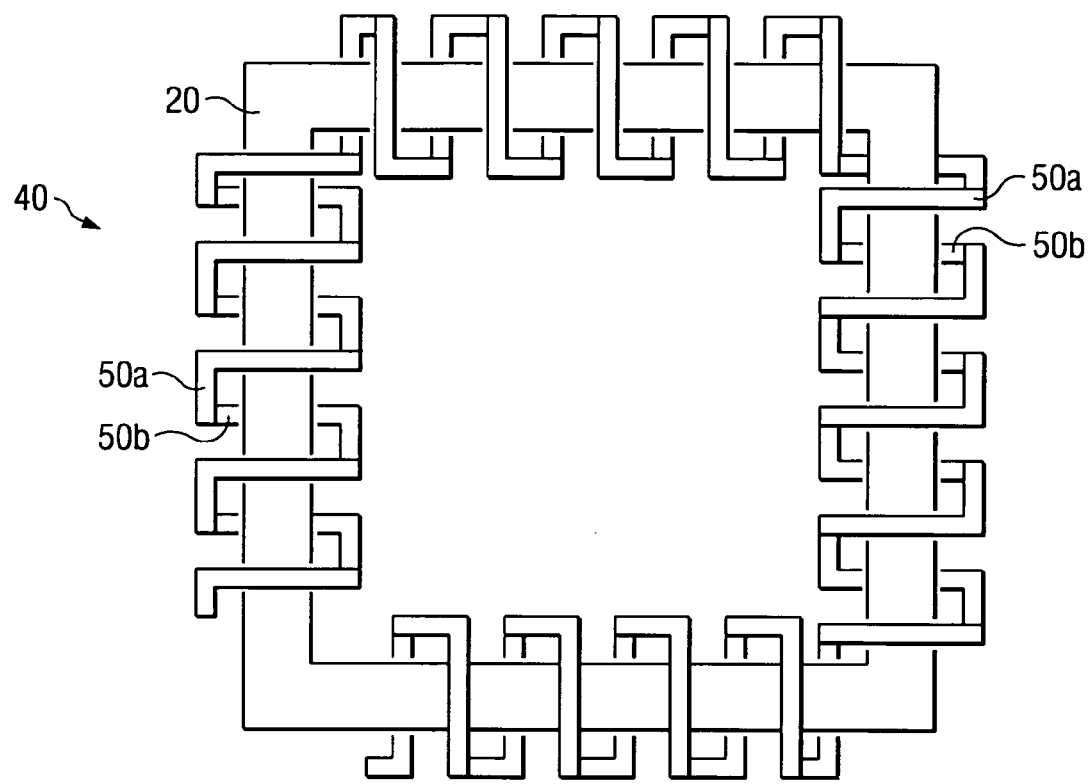
FIG. 3 is a top view of a toroidal inductor with a ferromagnetic core in accordance with another embodiment of the present invention.

The invention is not limited to the induction coil layout shown in FIGS. 1 and 2. Rather, it is within the scope of the invention to have induction coils of any suitable shape. For example, FIG. 3 illustrates a toroidal inductor 40 having "L" shaped bottom induction coils 50*a* and top induction coils 50*b*.

Figure 4:
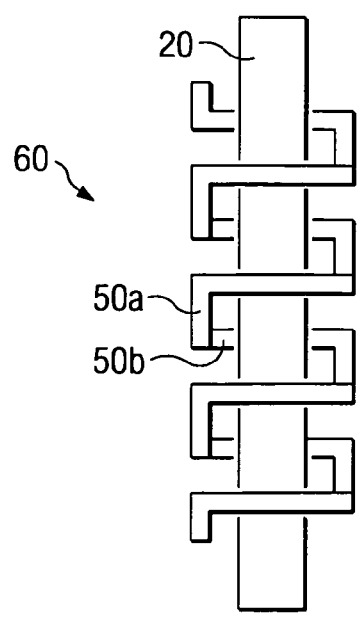
FIG. 4 is a top view of a solenoid with a ferromagnetic core in accordance with the present invention.
Figure 5:
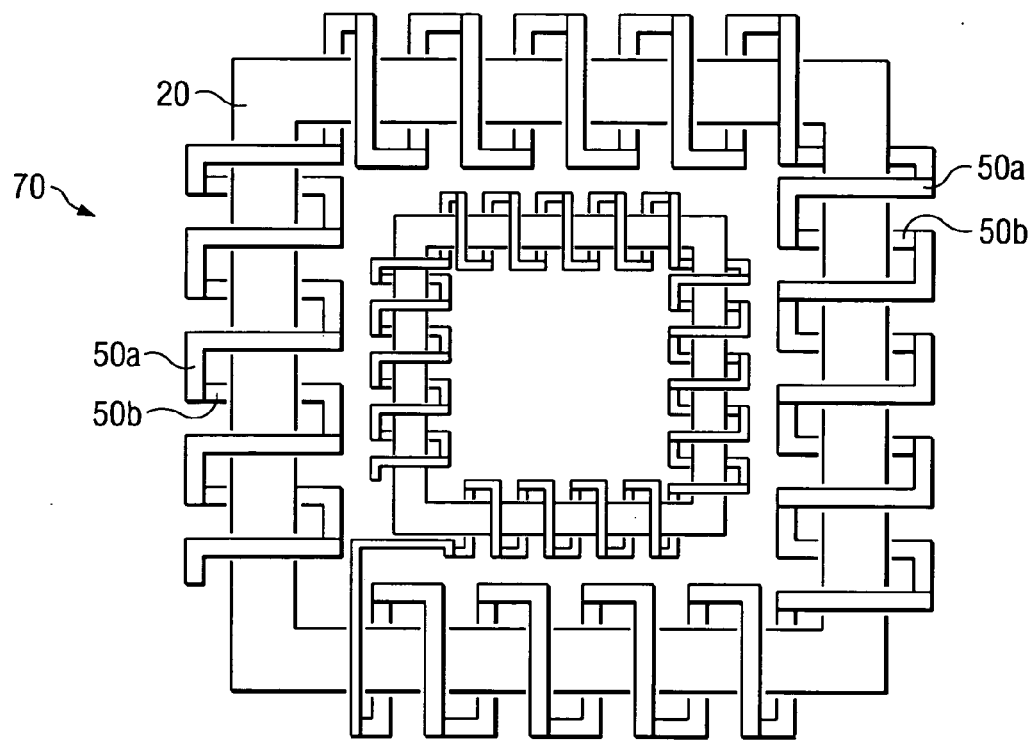
FIG. 5 is a top view of a nested toroidal inductor with a ferromagnetic core in accordance with the present invention.
Figure 6:
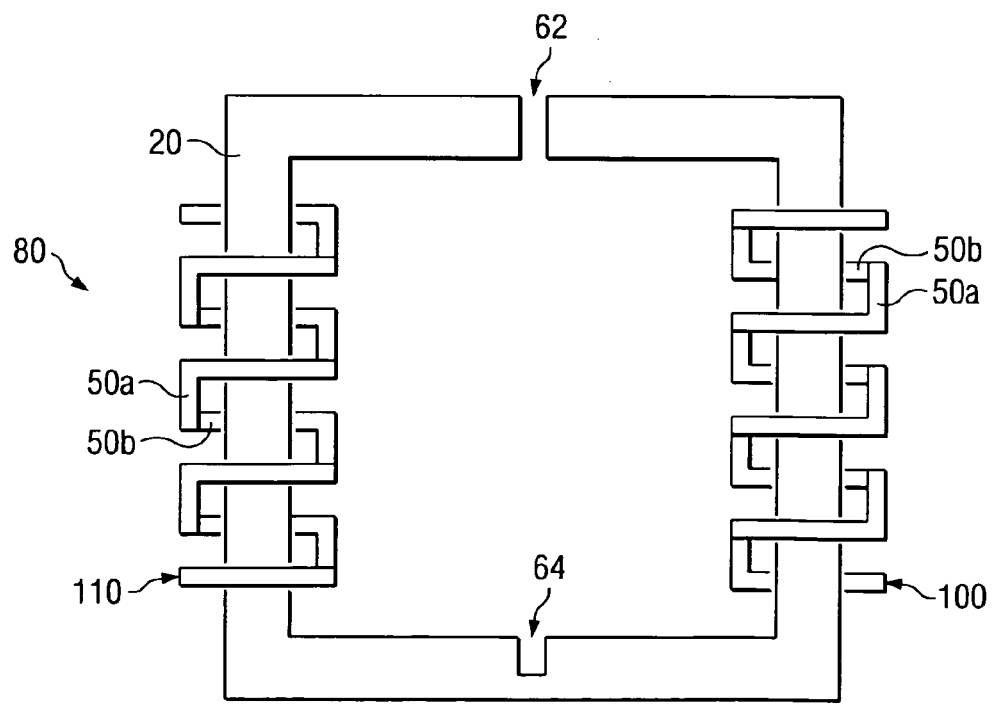
FIG. 6 is a top view of a transformer with a ferromagnetic core in accordance with the present invention.
Figure 7:
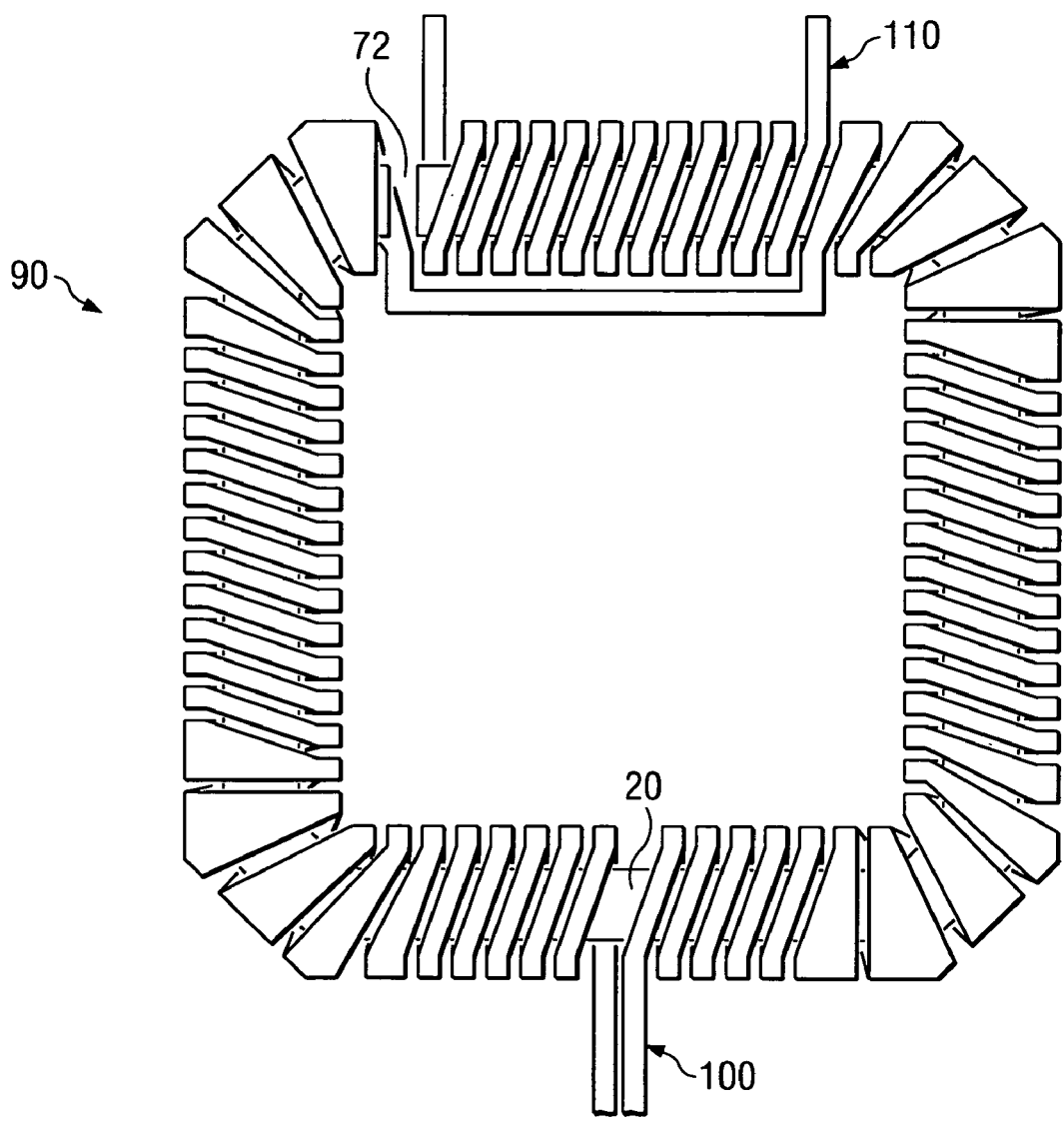
FIG. 7 is a top view of a transformer with a ferromagnetic core in accordance with another embodiment of the present invention.

Furthermore, it is within the scope of the invention to create various inductor configurations. For example, a solenoid 60 (FIG. 4) or a nested toroidal inductor 70 (FIG. 5) are within the scope of the invention. Furthermore, a transformer 80, 90 (FIGS. 6 and 7 respectively) having primary coils 100 and secondary coils 110 are also within the scope of the invention. Preferably, the ferromagnetic core 20 of the transformers 80, 90 contains at least one slot 62, 72, or partial slot 64, to block the flow of eddy currents (thereby increasing the efficiency of the transformer). Moreover, any inductor configuration (i.e. 10, 40, 60, 70) may incorporate a slotted ferromagnetic core 20. Preferably, the slots formed within the core are thin—as thin as 30 nm; however, these slots may be up to 500 thick.

Figure 8:
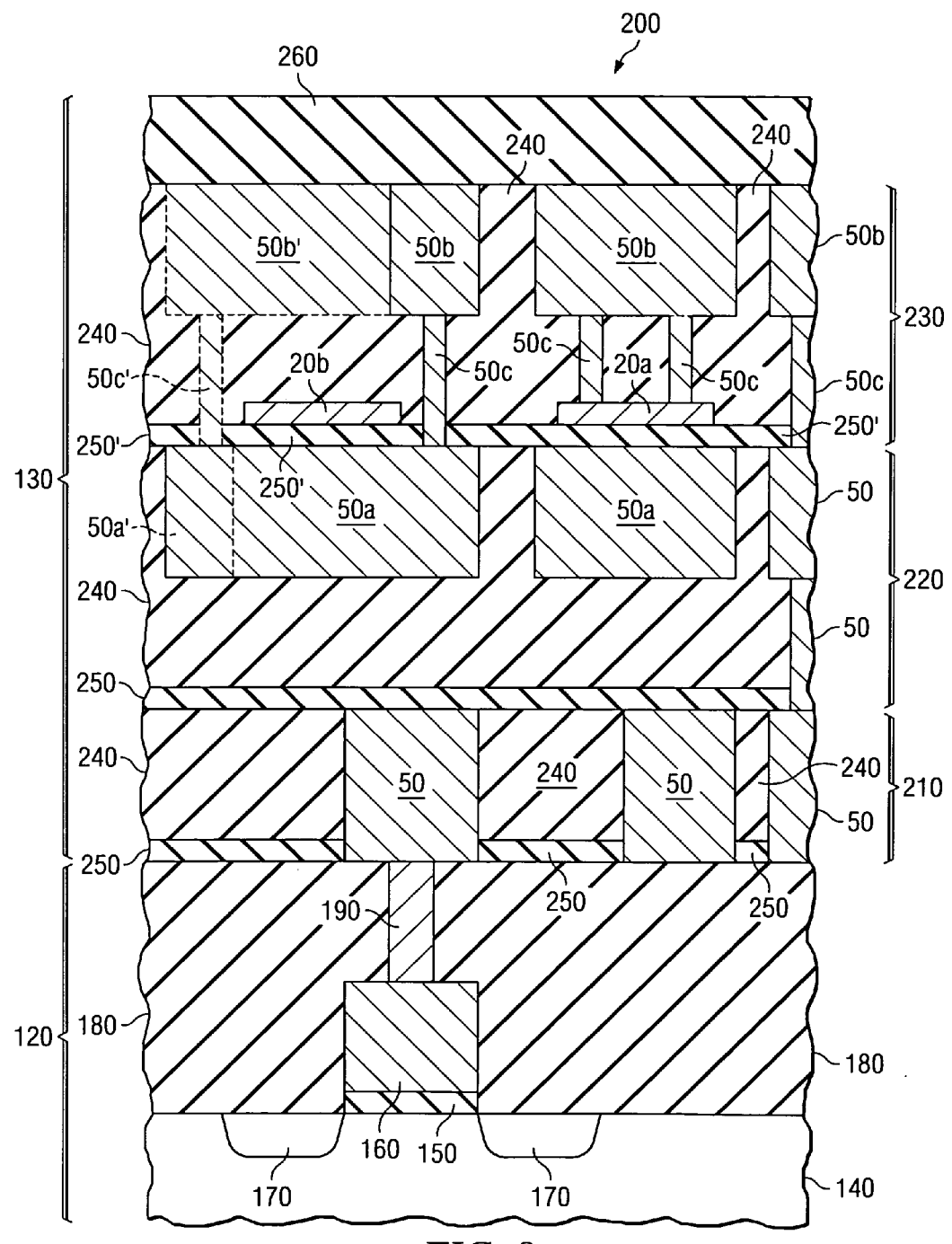
FIG. 8 is a cross-section view of a partial integrated circuit in accordance with the present invention.

FIG. 8 is a cross-section view of a portion of an integrated circuit 200 in accordance with the present invention. In general, an integrated circuit fabrication or process flow is divided into two parts: the fabrication of the Front-End-Of-Line (FEOL) structure 120 and the fabrication of the Back-End-Of-Line (BEOL) structure 130. The structure that includes the silicon substrate 140 is called the FEOL structure 120 of the integrated circuit 200. The FEOL structure 120 is often called the "transistor layer". The example portion of FEOL 120 shown in FIG. 8 includes a transistor having a gate oxide 150, a gate electrode 160, and source/drain 170; however, it is within the scope of the invention to have any form of logic within the FEOL structure 120.

Immediately above the transistor is a layer of dielectric insulation 180 containing metal contacts 190 that electrically tie the transistor to the other logic elements (not shown) of the FEOL structure 120. The dielectric insulation 180 may be any suitable material such as $SiO_2$. The contacts 190 may be comprised of any suitable conductive material such as W.

The BEOL 130 contains a single damascene metal interconnect layer 210 and at least one dual damascene metal interconnect layer 220, 230. Layers 210, 220 and 230 contain metal lines 50 that properly route electrical signals and power properly through the electronic device.

The metal lines 50 of the single damascene metal interconnect layer 210 are electrically insulated by dielectric material 240. The metal lines 50 may be comprised of any suitable conductive material, such as Cu, Ta, Ti, Au, Mg, Ag, Sn, Al, or even alloys of Cu with metals like Mg, Ag, Sn, Al, etc. The dielectric material 240 may be any low-k insulative material such as fluorinated silica glass ("FSG") or organosilicate glass ("OSG"). In addition, the single damascene metal interconnect layer 210 may have a thin dielectric layer 250 formed between the dielectric material 240 and the FEOL 120. Any suitable material may be used for the thin dielectric layer 250. For example, the thin dielectric layer 250 may comprise SiC, SiCN, SiCO, or $Si_3N_4$.

The thin dielectric layer 250 may perform many functions. For example, it may function as a diffusion barrier layer by preventing the copper in metal lines 50 from diffusing to the silicon channel of the transistor or to another isolated metal line (thereby creating an electrical short). Second, the thin dielectric layer 250 may function as an etch-stop when manufacturing the metal lines 50 within the dielectric insulation material 240. Lastly, the thin dielectric layer 250 may function as an adhesion layer to help hold a layer of dielectric 240 to the FEOL 120 or to the dual damascene layer 220. For purposes of readability, the thin dielectric layer 250 will be called the etch stop layer 250 during the rest of the description of this invention.

The dual damascene metal interconnect layers 220 and 230 contain metal interconnects and vias 50 that are electrically insulated by dielectric material 240. As with the single damascene metal interconnect layer 210, the metal lines 50 of the dual damascene metal interconnect layers 220, 230 may contain any metal, such as Cu. However, the use of other metals such as Ta, Ti, Au, Mg, Ag, Sn, Al, or alloys of Cu (with metals like Mg, Ag, Sn, Al, etc.) is within the scope of this invention. The dielectric material 240 of the dual damascene layers 220, 230 may also be OSG, FSG, any low-k film, or any ultra low-k film. The dual damascene layers 220, 230 preferably contain dielectric etch stop layers 250. Any suitable dielectric material, such as SiC, SiCN, SiCO, or $Si_3N_4$ may be used as the etch-stop layers 250 for the dual damascene metal interconnect layers 220, 230.

It is within the scope of the invention to fabricate an integrated circuit 200 with one or more single damascene metal interconnect layers 210 and/or one or more dual damascene metal interconnect layers 220, 230. A protective overcoat 260 is usually formed over the last metal interconnect layer to provide an oxygen and moisture barrier. Any suitable material may be used for the protective overcoat 260, such as $SiO_2$ or SiN.

In accordance with the present invention, one of the metal interconnect layers 230 of the integrated circuit 200 contains a layer of ferromagnetic material 20 that is used to form both a capacitor top plate 20a and an induction coil 20b for an inductor or transformer. Also in accordance with the invention, the ferromagnetic capacitor top plate 20a is formed in the same mask step as the ferromagnetic induction core 20b, as described more fully below. The ferromagnetic layer 20 is preferably comprised of Co. However it is within the scope of the invention to use any suitable ferromagnetic material, such as Ni, Fe, or ferromagnetic alloys.

The example capacitor shown in FIG. 8 (i.e. in the upper right quadrant) is comprised of the copper bottom plate 50a located within metal interconnect layer 220, a portion of the etch stop layer 250 (that serves as the capacitor dielectric), and the ferromagnetic top plate 20a. The capacitor of the present invention takes the place of the planar metal-insulator-metal (MIM) capacitor that is often used in BEOL structures 130. It is to be noted that vias 50c and a metal line 50b electrically connect the capacitor to other logic elements (not shown) of the FEOL structure 120.

The example inductor shown in FIG. 8 (i.e. in the upper left quadrant) is a portion of the inductor shown in FIG. 3. Therefore, the example inductor shown in FIG. 8 has "L" shaped induction coils 50a, 50b. However, the example inductor shown in FIG. 8 could also be a portion of the solenoid of FIG. 4, the nested inductor of FIG. 5, or the transformer of FIG. 6. The example inductor shown in FIG. 8 is comprised of the copper "L" shaped bottom portion of an induction coil 50a located within metal interconnect layer 220, the insulated ferromagnetic core 20b located within metal interconnect layer 230, and the copper "L" shaped top portion of an induction coil 50a located within metal interconnect layer 230.

Figure 9:
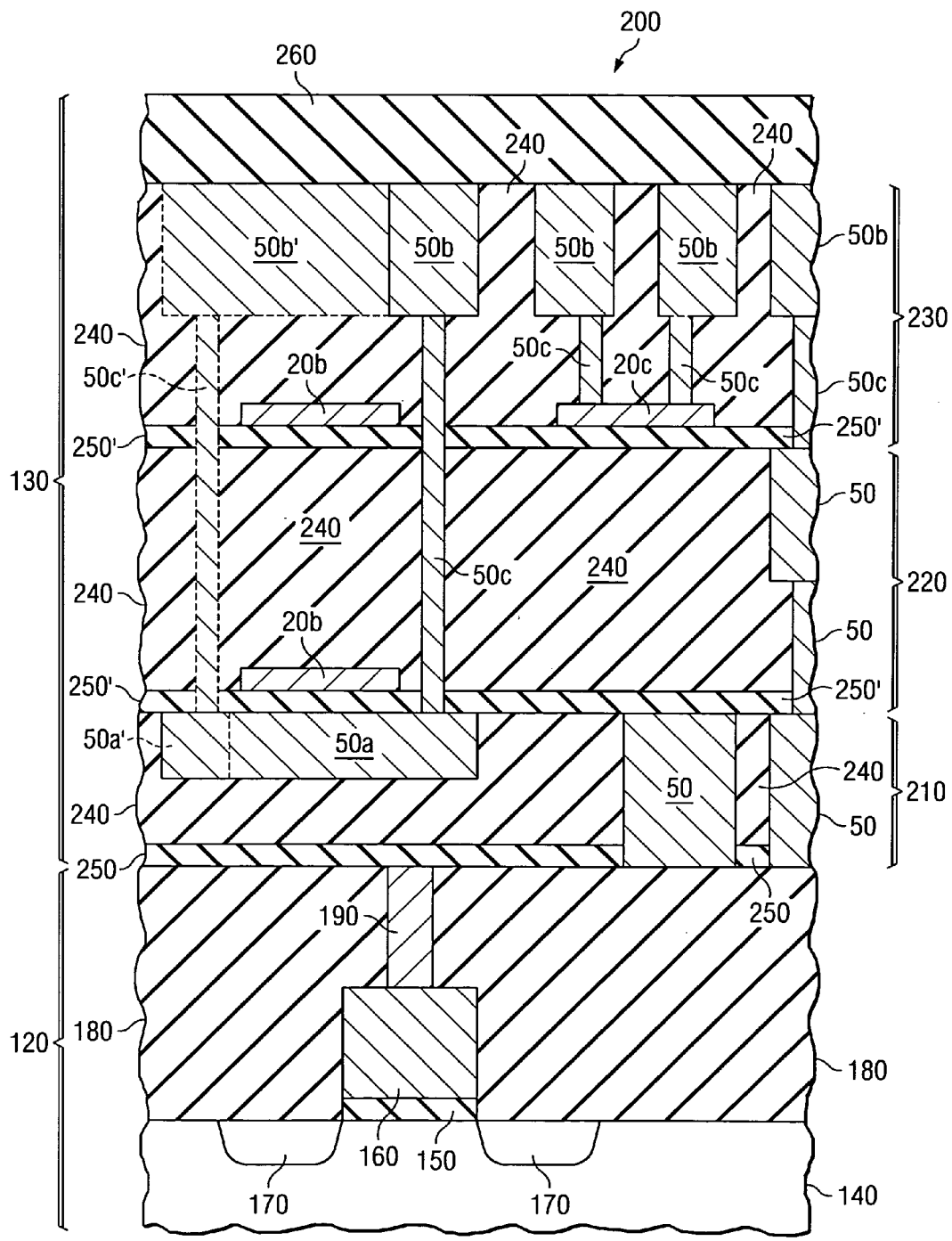
FIG. 9 is a cross-section view of a partial integrated circuit in accordance with another embodiment of the present invention.

It is to be noted that the inductor or transformer of the present invention does not need to be formed in two consecutive metal interconnect layers (as shown in FIG. 8). Rather, the inductor or transformer may be formed within three or more sequential metal interconnect layers, as shown in FIG. 9. If the inductor or transformer is formed within three or more sequential metal interconnect layers then it is within the scope of the invention to add additional ferromagnetic cores 20b, as also shown in FIG. 9.

Figure 10A:
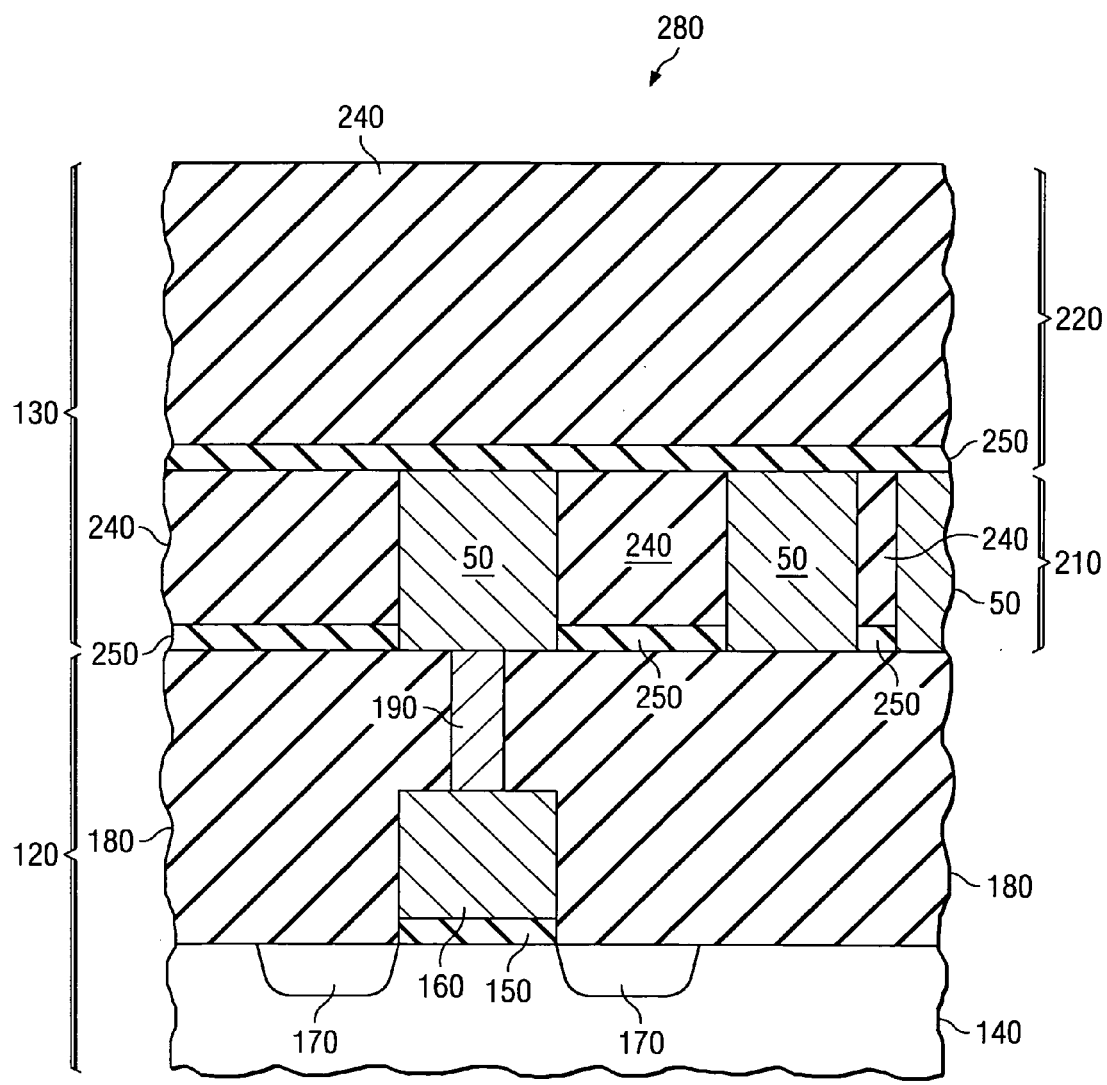
FIGS. 10A–10J are cross-sectional diagrams of a process for forming ferromagnetic capacitors, inductors, and transformers, in accordance with the present invention.

FIGS. 10A–10J are cross-sectional diagrams of a process for forming ferromagnetic capacitors, inductors, and transformers, within an integrated circuit 280 in accordance with the present invention. The present invention may be used in any integrated circuit configuration; therefore the first step is to fabricate the front-end structure 120 to create any logic elements necessary to perform the desired integrated circuit function, as shown in FIG. 10A. In addition, because the example manufacturing process will form the ferromagnetic capacitors, inductors, and transformers in the two dual damascene metal interconnect layers 220, 230; the single damascene layer 210 of the BEOL 130 is fabricated over the FEOL 120 using current manufacturing processes.

Next, a etch-stop layer 250 for the metal interconnect layer 220 is formed over the entire semiconductor wafer 140 (i.e. over the metal interconnect layer 210). The etch-stop layer 250 may be formed using any manufacturing process such as Plasma-Enhanced Chemical Vapor Deposition ("PECVD"). In this example application, the etch-stop layer 250 is comprised of SiC; however, other dielectric materials such as SiCN, SiCO, or $Si_3N_4$ may be used.

Next a low-k dielectric layer 240 is formed over the entire wafer (i.e. over the etch-stop layer 250). The low-k dielectric material may be applied to the substrate with a Chemical Vapor Deposition ("CVD") or a spin-on manufacturing process. In the example application, the dielectric layer 240 is an OSG film. However, any other low-k dielectric (e.g. k<3.0), or a combination or stack of low-k dielectric materials, may be used (such as FSG, or an ultra low-k film (e.g. k<2.5)).

Figure 10B:
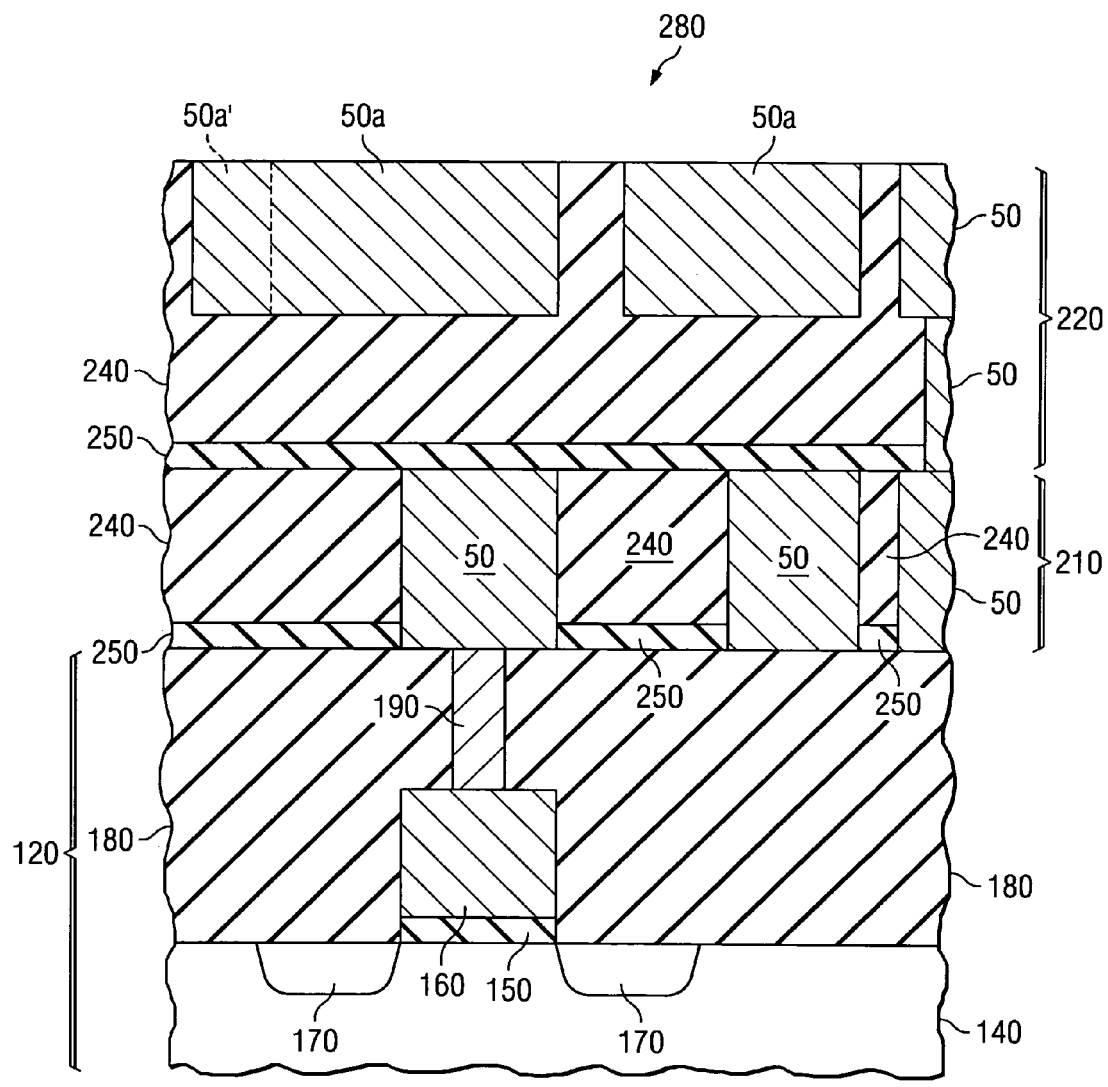

Referring now to FIG. 10B, a standard photoresist pattern and etch process (described more fully below) is used to form the holes for the metal lines 50—including the bottom plate 50a of the capacitor and the "L" shaped bottom portion 50a of the example induction coil. In the example application a layer of copper is deposited over the entire semiconductor wafer 140 and then the top of the copper layer is polished (using standard manufacturing processes) to form both the bottom portion of the induction coil and the bottom plate of the capacitor, as shown in FIG. 10B. Note that a part of the "L" shape of the example bottom induction coil 50a extends away from the plane of the drawing figure. This is indicated by the dashed line and is marked 50a' (and similarly marked in FIG. 8).

Figure 10C:
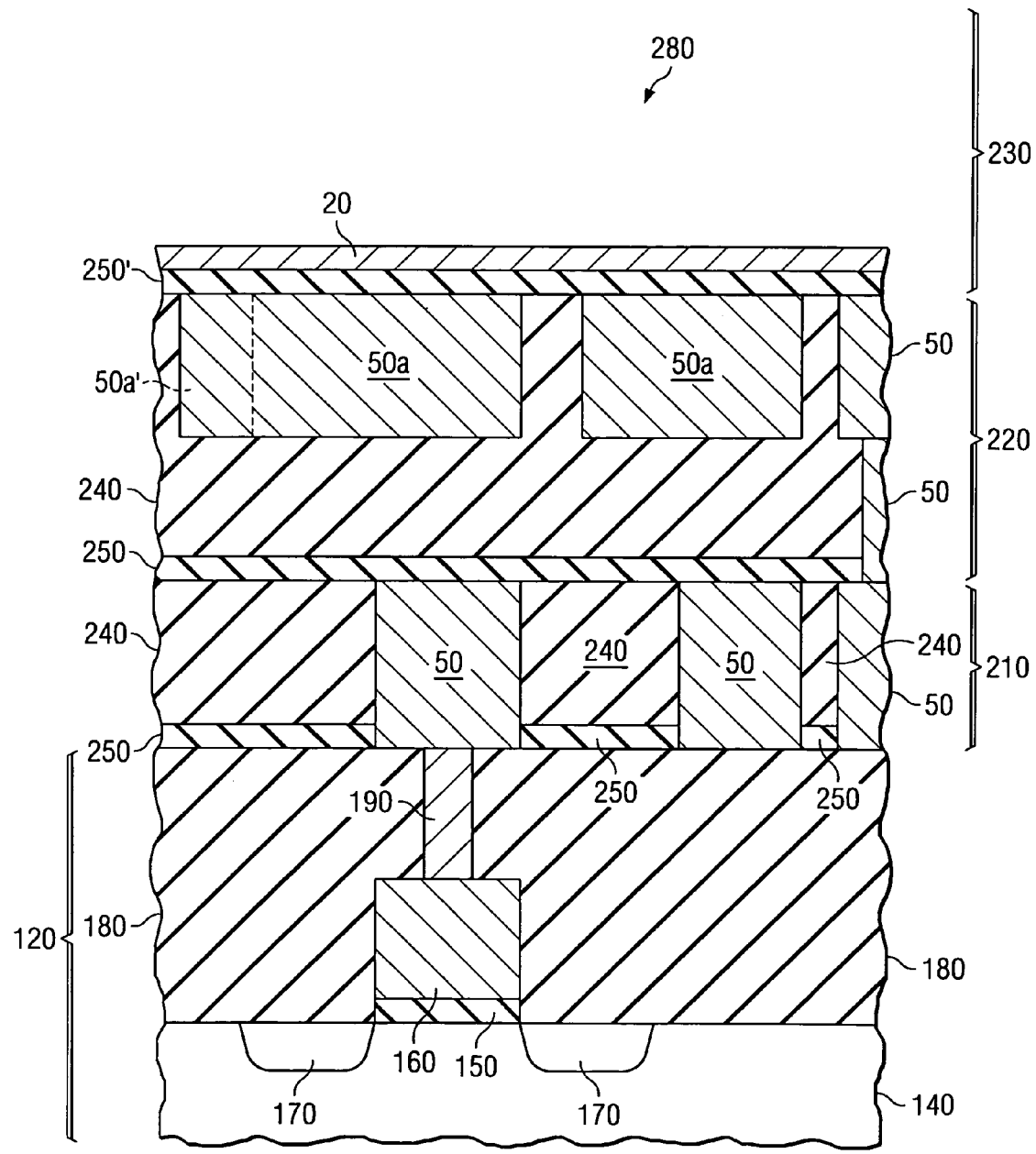
Figure 10D:
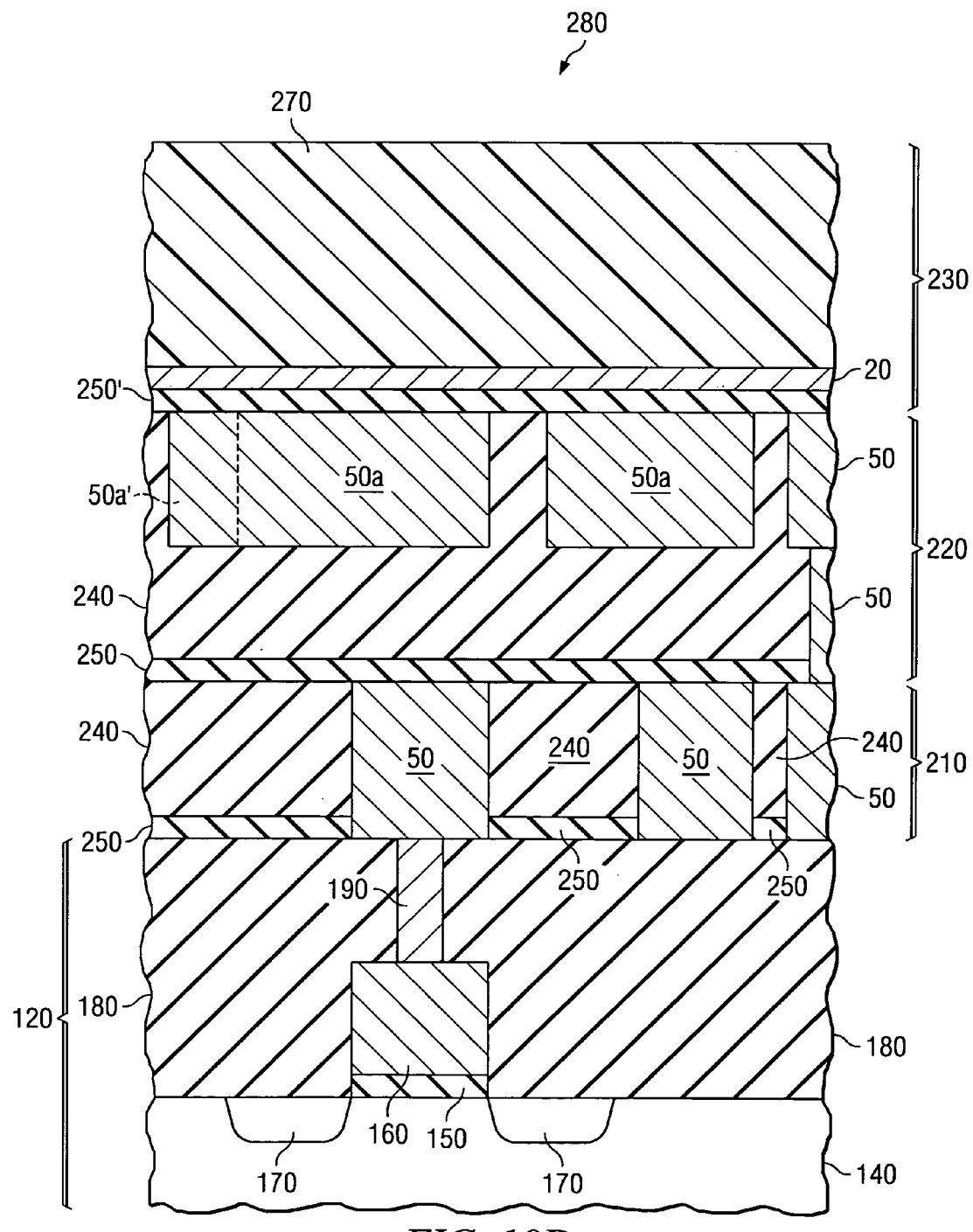
Figure 10E:
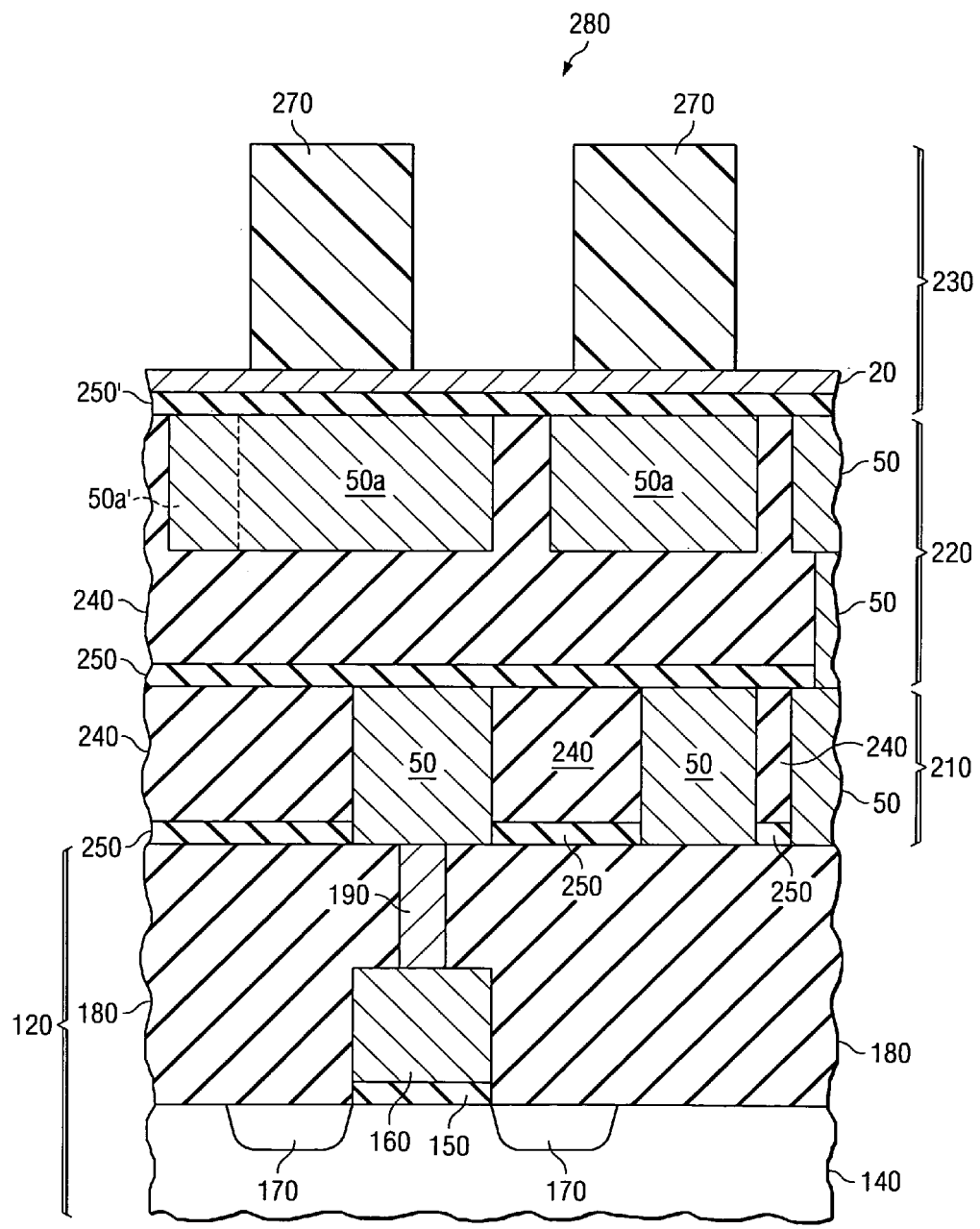

As shown in FIG. 10C, the etch-stop layer 250' for the next metal interconnect layer 230 is now formed over the entire semiconductor wafer 140 (i.e. over the metal interconnect layer 220). This etch-stop layer 250' is preferably SiN and is preferably deposited by a PECVD process. However, other suitable materials or processes may be used. The portion of this etch stop layer 250' that is coupled to the bottom plate 50a of the capacitor will be the dielectric for the capacitor once the fabrication of the metal interconnect layer 230 is complete.

In accordance with the invention, a layer of ferromagnetic material 20 is now deposited over the etch stop layer 250', as shown in FIG. 10C. The ferromagnetic material 20 is preferably Co; however the use of other ferromagnetic materials are within the scope of the invention. For example, the ferromagnetic layer 20 may be comprised of Ni, Fe, or any ferromagnetic alloy. Moreover, it is within the scope of the invention to form a laminated ferromagnetic layer in order to reduce eddy currents. The layer of Co ferromagnetic material 20 in the example application may be deposited by any suitable process, but it is preferably deposited with a PECVD process using a standard machine (such as the Endura which is manufactured by Applied Materials).

Also in accordance with the invention, a single mask step is now used to create the top plate 20a of the capacitor and a core 20b that is proximate to the bottom portion of the induction coil 50a. A layer of photoresist 270 is applied (FIG. 10D) and then patterned by a standard lithography and anisotropic etch process (FIG. 10E) to create a template for etching the ferromagnetic layer 20 to form ferromagnetic structures 20a, 20b.

Figure 10F:
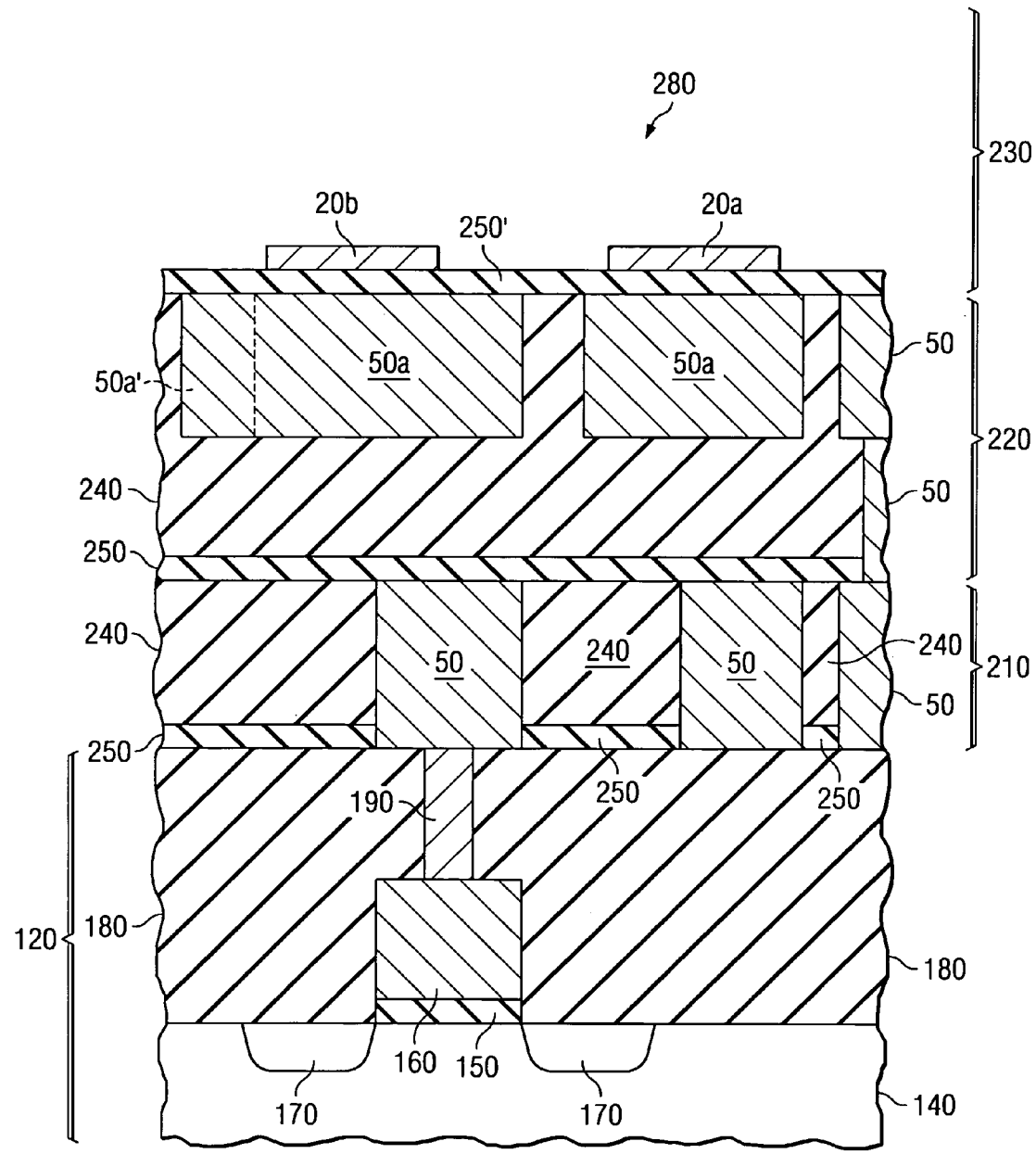

As shown in FIG. 10F, the ferromagnetic layer is now etched, forming the top plate 20a of the capacitor and a slotted core 20b that is proximate to the bottom portion of the induction coil 50a. Any suitable process may be used to etch the ferromagnetic layer 20. Preferably, the ferromagnetic layer 20 is etched with a plasma etch process using a DPS metal etcher (made by Applied Materials). Once the ferromagnetic layer 20 has been etched, the photoresist is removed by a standard ash process plus an optional wet clean.

Figure 10G:
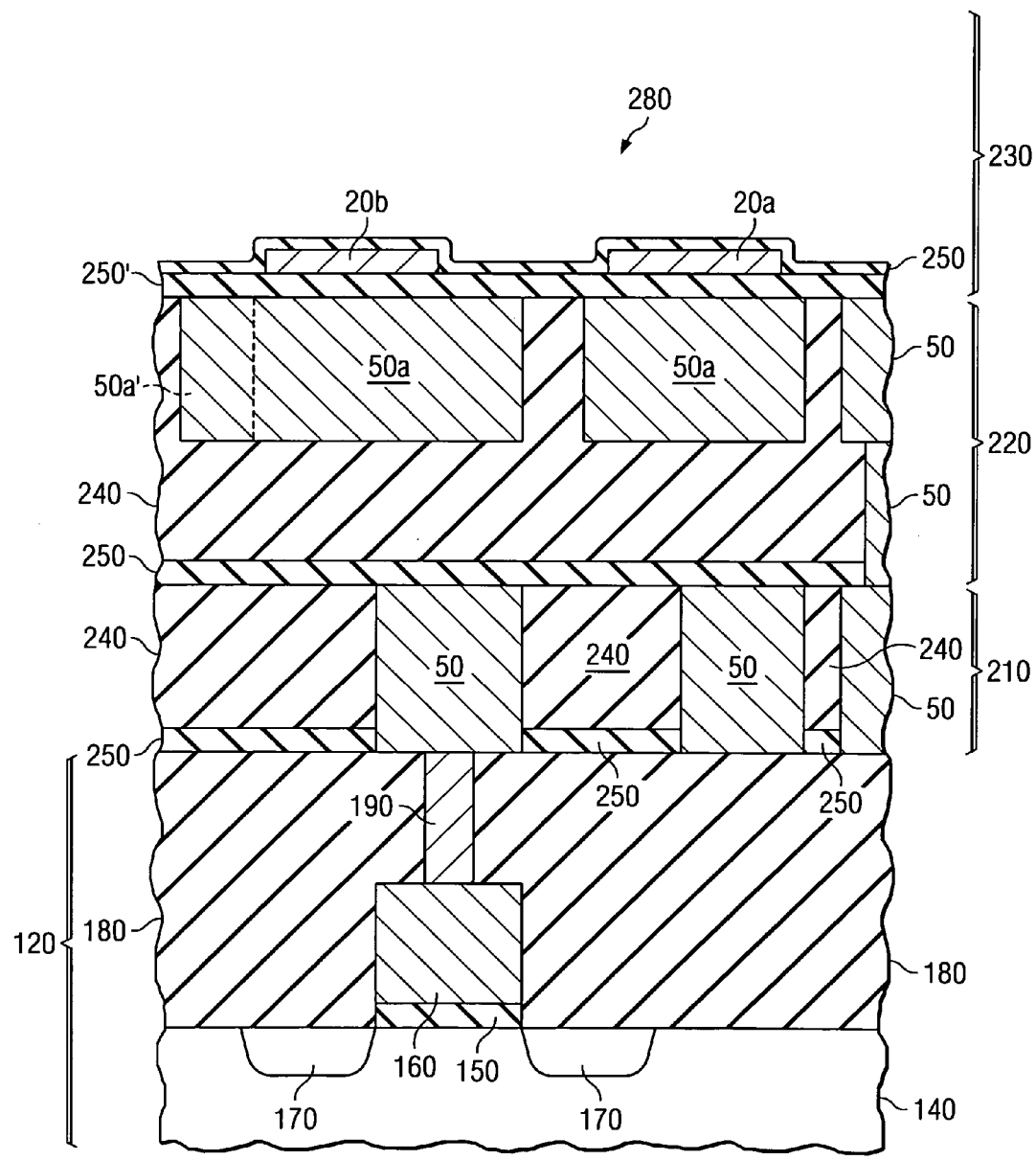

In the example application, shown in FIG. 10G, a second etch stop layer 250 is now deposited. However, the use of this second etch stop layer is optional. If used, this second etch stop layer 250 provides increased selectivity during the etch of the dielectric layer (which is formed in next step), thereby providing increased control over the spacing between the core 20b and the top portion of the induction coil 50b. In the example application, the second etch stop layer 250 of the metal interconnect layer 230 is comprised of SiC and is deposited by a PECVD process. However, other suitable materials or processes may be used.

Figure 10H:
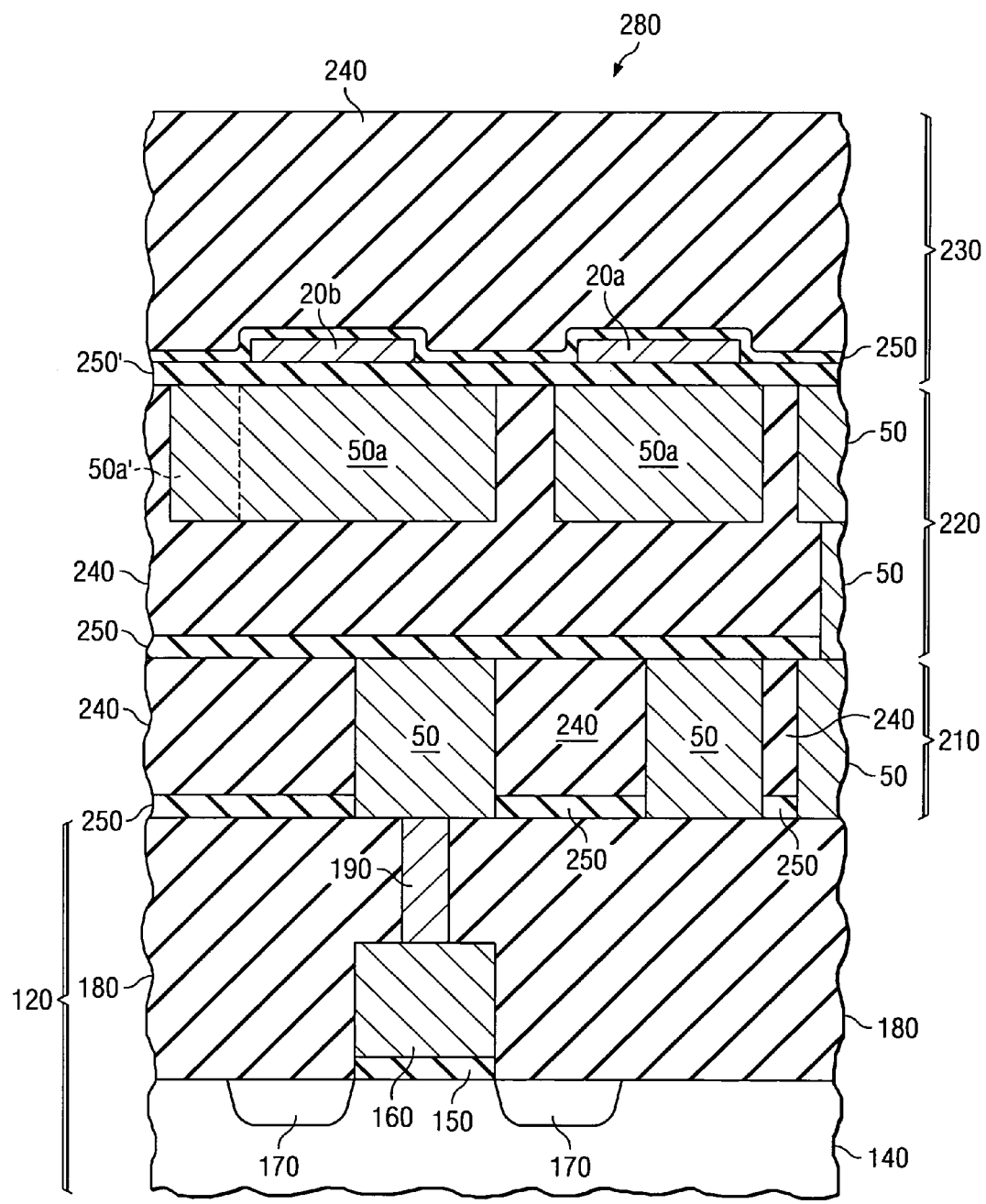

Referring to FIG. 10H, the dielectric 240 of the metal interconnect layer 230 is now formed over the semiconductor wafer 140 (in this example it is formed over the optional second etch stop layer 250). In the example application, the dielectric layer 240 is a low-k material such as OSG, or FSG. However, any suitable dielectric material may be used. In addition, the dielectric layer may be formed using any standard process, such as CVD.

Figure 10I:
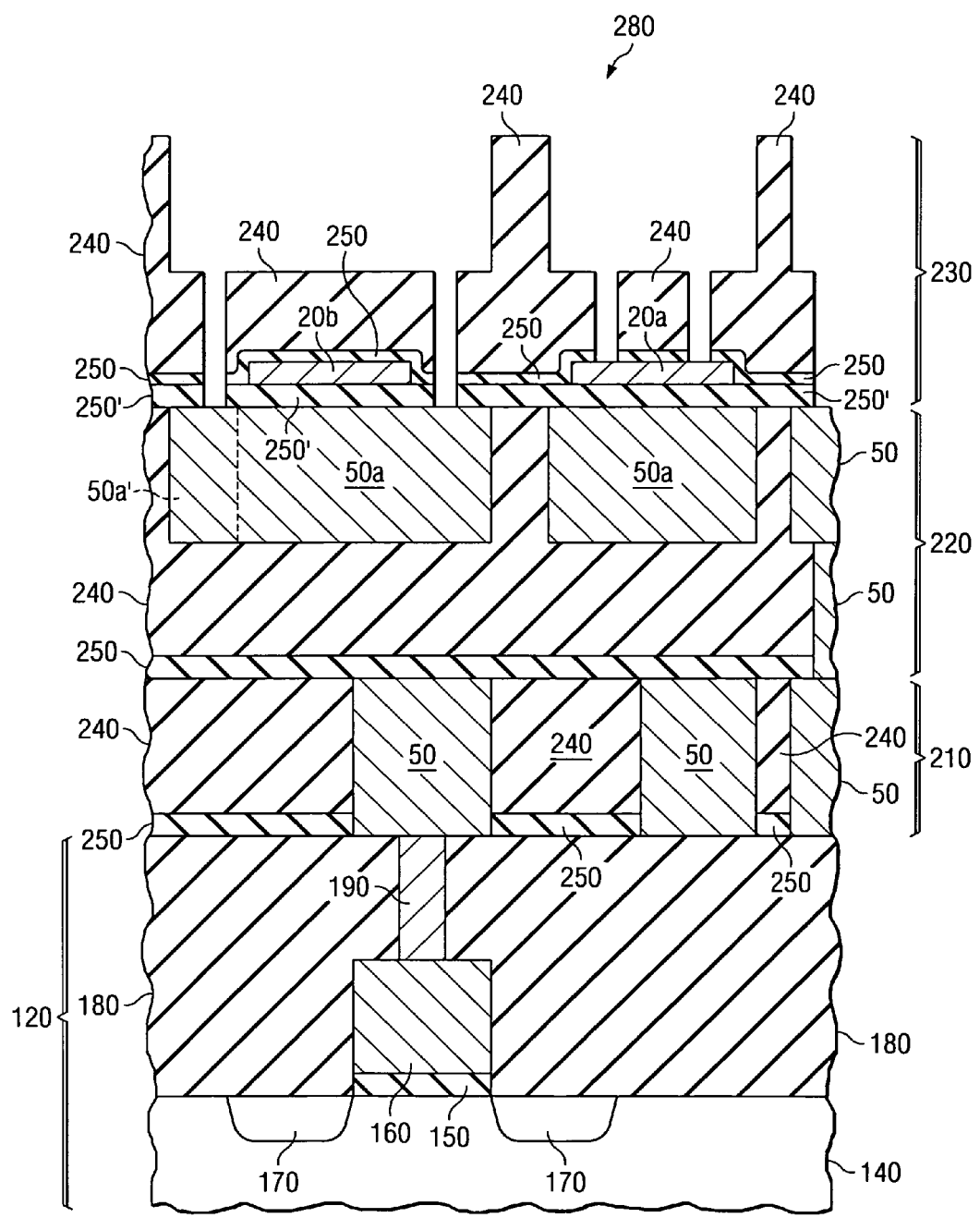
Figure 10J:
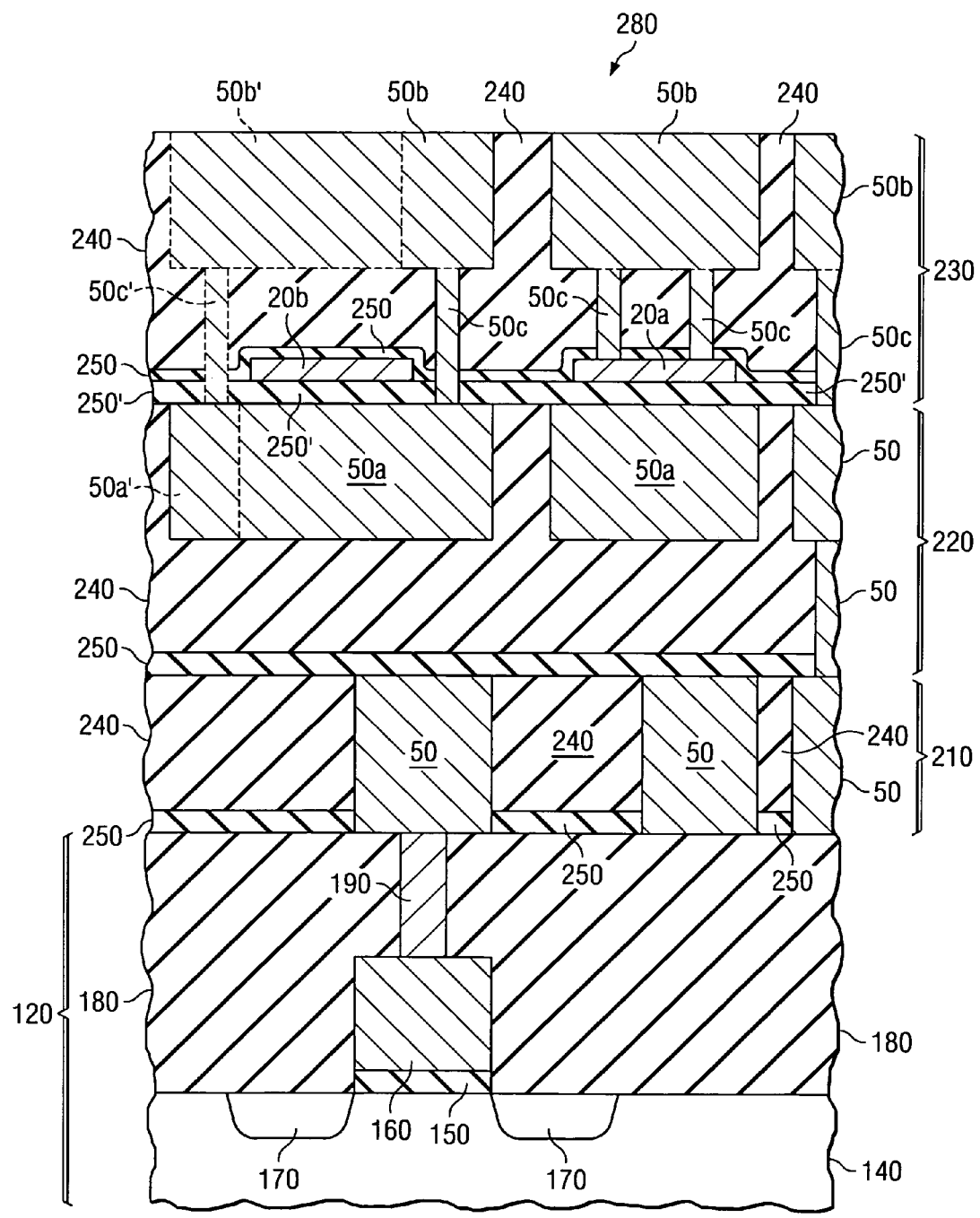

Using a standard photoresist pattern and etch process, the dielectric layer 240 is etched to create voids for the deposition of the conductive material that will form metal lines 50 within the metal interconnect layer 230—including the top portion of the induction coil, the vias that couple the top portion and bottom portion of the induction coil, and the metal lines and vias of the capacitor. In the "via-first" process of the example application, a layer of photoresist is applied and patterned for the via structures 50c. Then holes for the vias 50c are etched using any well-known manufacturing process such as fluorocarbon-based plasma etch with a reactive ion etch ("RIE") machine. When the etch process is complete the photoresist is removed by an ash process plus an optional wet clean. Next, another layer of photoresist is applied and patterned for the "trench" structures 50b. Then holes for the trenches 50b are etched using any well-known manufacturing process such as fluorocarbon-based plasma etch with a RIE machine. When the etch process is complete the photoresist is removed by an ash process plus an optional wet clean. FIG. 10I shows the integrated circuit 280 at this stage of the fabrication process.

The top portion of the induction coil 50b, the vias 50c that couple the top portion of the induction coil 50b to the bottom portion of the induction coil 50a, the metal line 50b for the capacitor, the vias 50c that connect the capacitor to other logic elements, other metal interconnects 50b, and other vias 50c are now formed. In the example application the metal lines are copper. The copper metal lines are formed by depositing a copper seed layer and then a applying layer of copper material 50 over the semiconductor substrate through a standard technique such as electro-chemical deposition ("ECD"). The copper layer 50 is then polished until the top surface of the dielectric 240 is exposed and the copper features 50b, 50c are formed (see FIG. 10J). The polish step is performed with a Chemical Mechanical Polish ("CMP") process; however, other manufacturing techniques may be used. Note that a part of the "L" shape of the example top induction coil 50b and the associated via 50c is formed parallel to—yet offset from—the plane of the drawing figure. This is indicated by the dashed line and is marked 50b' and 50c' (and similarly marked in FIG. 8).

Now the fabrication of the integrated circuit 280 continues using standard manufacturing techniques until the fabrication of the electronic device is complete. For example, additional dual damascene layers of the back-end structure 130 may now be fabricated using either standard manufacturing techniques or the techniques of the present invention. After the last dual damascene layer is complete, a protective overcoat layer 260 (see FIG. 8) is commonly formed over the semiconductor wafer. Then bond pads are created, the integrated circuit is tested, cut from the semiconductor wafer, and then packaged.

Various modifications to the invention as described above are within the scope of the claimed invention. As an example, the induction coils 50a, 50b, 50c, and the capacitor plates 50a, 20a may be any shape or size. In addition, the top capacitor plate 20a may be a different size and shape than the bottom capacitor plate 50a, plus the top portion of the induction coil 50b may be a different shape than the bottom portion of the induction coil 50a. Furthermore, the ferromagnetic material 20 may be used to create a thin-film resistor 20c, as shown in FIG. 9 (i.e. in the upper right quadrant), during the mask steps (i.e. FIGS. 10D–10F) that create the capacitor top plate 10a and the inductor core 10b.

Instead of the via first fabrication process described above, a "trench first" process may be used. If a trench first process is used then the holes for the trenches 50b are etched in the dielectric layer 240 before the holes for the vias 50c are etched.

During the formation of the copper features 50, a thin barrier film may be deposited in the holes in the dielectric layer 240 before the deposition of the copper layer 50. This barrier film may be comprised of any suitable material such as TaN and may be deposited by a PVD process. The metal seed layer may be any suitable material such as copper and may be deposited by a PVD process.

Instead of using positive photoresist as described above, negative photoresist may be used. In addition, a layer of anti-reflective coating may be applied before the layer of photoresist is applied. Furthermore, a cap layer may be formed over the dielectric layer 19 to serve as a hard mask during the etch of the vias and trenches or serve as a stop layer for CMP process. Moreover, it is within the scope of the invention to have a back-end structure 130 with a different amount or configuration of metal layers 210, 220, 230 than is shown in FIGS. 8 and 9.

The semiconductor substrate in the example application includes a semiconductor crystal, typically silicon. However, other semiconductors such as GaAs and InP may be used. In addition to a semiconductor crystal, the substrate 140 may include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, the invention is applicable to other semiconductor technologies such as BiCMOS, bipolar, SOI, strained silicon, pyroelectric sensors, optoelectronic devices, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of manufacturing an integrated circuit on a semiconductor wafer comprising:
    forming a FEOL structure over said semiconductor wafer;
    forming a first metal interconnect layer over said FEOL structure, said first metal interconnect layer containing a bottom plate of a capacitor and a bottom portion of an induction coil;
    forming an etch stop layer of a second metal interconnect layer over said first metal interconnect layer;
    forming a ferromagnetic layer over said etch stop layer;
    forming a photoresist layer over said ferromagnetic layer;
    patterning said photoresist layer;
    etching said ferromagnetic layer to form a top plate of said capacitor and also a core that is proximate to said bottom portion of an induction coil;
    forming a dielectric layer of said second metal interconnect layer over said semiconductor wafer; and
    forming within said dielectric layer of said second metal interconnect layer a top portion of said induction coil plus vias that couple said top portion of said induction coil to said bottom portion of said induction coil.

2. The method of claim 1 wherein a portion of said etch stop layer is a dielectric of said capacitor.

3. The method of claim 1 wherein said ferromagnetic layer comprises Co.

4. The method of claim 1 wherein said bottom portion of said induction coil, said top portion of said induction coil, said vias, and said core form an inductor.

5. The method of claim 4 wherein said inductor is a solenoid.

6. The method of claim 4 wherein said inductor is a toroidal inductor.

7. The method of claim 1 wherein said bottom portion of said induction coil, said top portion of said induction coil, said vias, and said core form a transformer.

8. The method of claim 1 wherein said bottom plate comprises Cu.

9. The method of claim 1 wherein said bottom portion of said inductor coil, said top portion of said induction coil, and said vias comprise Cu.

10. The method of claim 1 wherein said etch stop layer comprises SiN.

11. The method of claim 1 wherein said dielectric layer of said second metal interconnect layer comprises a low-k dielectric material.

12. The method of claim 1 wherein said ferromagnetic layer is laminated.

13. The method of claim 1 wherein said ferromagnetic layer contains slots.

14. The method of claim 1 further comprising the step of forming an additional etch stop layer of said second metal interconnect layer over said semiconductor wafer before said step of forming a dielectric layer.

15. The method of claim 1 wherein said first metal interconnect layer is separated from said second metal interconnect layer by at least one additional metal interconnect layer, each of said additional metal interconnect layers containing vias coupled to said bottom portion of an induction coil and to said vias of said second metal interconnect layer.

16. The method of claim 14 wherein at least one of said additional metal interconnect layers contains a ferromagnetic core.

17. The method of claim 1 wherein said step of etching said ferromagnetic layer also forms a thin-film resistor.

18. A method of manufacturing an integrated circuit on a semiconductor wafer comprising:
    forming a FEOL structure over said semiconductor wafer;
    forming a first metal interconnect layer over said FEOL structure, said first metal interconnect layer containing a copper bottom plate of a capacitor and a copper bottom portion of an induction coil;
    forming a silicon nitride first etch stop layer of a second metal interconnect layer over said first metal interconnect layer, said capacitor having a portion of said etch stop layer as a dielectric;
    forming a cobalt ferromagnetic layer over said silicon nitride first etch stop layer;
    forming a photoresist layer over said cobalt ferromagnetic layer;
    patterning said photoresist layer;
    etching said cobalt ferromagnetic layer to form a top plate of said capacitor and also a core that is proximate to said copper bottom portion of an induction coil;
    forming a silicon carbide second etch stop layer of said second metal interconnect layer over said semiconductor wafer;
    forming a low-k dielectric layer of said second metal interconnect layer over said semiconductor wafer; and
    forming a copper top portion of said induction coil plus copper vias that couple said copper top portion of said induction coil to said copper bottom portion of said induction coil.

19. The method of claim 18 wherein said copper bottom portion of said induction coil, said copper top portion of said induction coil, said copper vi as, and said cobalt ferromagnetic core form an inductor.

20. The method of claim 19 wherein said inductor is a solenoid.

21. The method of claim 19 wherein said inductor is a toroidal inductor.

22. The method of claim 18 wherein said core contains at least one slot, and further wherein said copper bottom portion of said induction coil, said copper top portion of said induction coil, said copper vias, and said slotted cobalt ferromagnetic core form a transformer.

* * * * *